(12) United States Patent
Nakanishi

(10) Patent No.: US 10,151,893 B2
(45) Date of Patent: Dec. 11, 2018

(54) OPTICAL MODULE

(71) Applicant: Sumitomo Electric Industries, Ltd., Osaka-shi (JP)

(72) Inventor: Hiromi Nakanishi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/546,415

(22) PCT Filed: Feb. 25, 2016

(86) PCT No.: PCT/JP2016/055638
§ 371 (c)(1),
(2) Date: Jul. 26, 2017

(87) PCT Pub. No.: WO2016/140137
PCT Pub. Date: Sep. 9, 2016

(65) Prior Publication Data
US 2018/0024303 A1    Jan. 25, 2018

(30) Foreign Application Priority Data
Mar. 2, 2015    (JP) ................... 2015-040241

(51) Int. Cl.
*G02B 6/32*    (2006.01)
*G02B 6/42*    (2006.01)
(Continued)

(52) U.S. Cl.
CPC .......... *G02B 6/424* (2013.01); *G02B 6/4206* (2013.01); *G02B 6/4215* (2013.01);
(Continued)

(58) Field of Classification Search
CPC ...... G02B 6/32; G02B 6/4214; G02B 6/4206; G02B 6/4204; G02B 6/4249
See application file for complete search history.

(56) References Cited

U.S. PATENT DOCUMENTS 4,625,333 A * 11/1986 Takezawa ................ G02B 6/42
                                                          257/E31.095
5,537,503 A *  7/1996 Tojo ..................... G02B 6/4207
                                                               385/147
(Continued)

FOREIGN PATENT DOCUMENTS

JP    H10-170767 A    6/1998
JP    2004-354752 A   12/2004
(Continued)

*Primary Examiner* — Jennifer Doan
(74) *Attorney, Agent, or Firm* — Venable LLP; Michael A. Satori; Laura G. Remus

(57) ABSTRACT

An optical module includes a light-forming part; a protective member and including an output window and disposed so as to surround the light-forming part; an adapter connected to the protective member and including an optical passage through which light emitted from the light-forming part and transmitted by the output window passes; and an optical coupling component that is connected to the adapter and that light passing through the optical passage enters. The light-forming part includes semiconductor light-emitting devices and lenses configured to convert, in terms of spot size, light emitted from the semiconductor light-emitting devices. The optical coupling component includes an optical component and a support member supporting the optical component. The support member and the adapter are connected together.

8 Claims, 8 Drawing Sheets

(51) Int. Cl.
 *G02B 27/09* (2006.01)
 *H01S 5/00* (2006.01)
 *H01S 5/022* (2006.01)
 *H01S 5/40* (2006.01)

(52) U.S. Cl.
 CPC ......... *G02B 6/4237* (2013.01); *G02B 6/4251* (2013.01); *G02B 27/0916* (2013.01); *G02B 27/0955* (2013.01); *H01S 5/005* (2013.01); *H01S 5/02284* (2013.01); *H01S 5/02296* (2013.01); *H01S 5/4093* (2013.01); *G02B 6/4271* (2013.01); *G02B 6/4285* (2013.01); *H01S 5/02216* (2013.01); *H01S 5/02248* (2013.01); *H01S 5/4012* (2013.01)

(56) References Cited

U.S. PATENT DOCUMENTS

| | | | |
|---|---|---|---|
| 9,243,761 B2 * | 1/2016 | Nakanishi | G03B 21/2033 |
| 2014/0166975 A1 * | 6/2014 | Ito | H01L 33/22 |
| | | | 257/13 |

FOREIGN PATENT DOCUMENTS

| | | | |
|---|---|---|---|
| JP | 2007-017925 A | 1/2007 |
| JP | 2007-065600 A | 3/2007 |
| JP | 2007-328895 A | 12/2007 |
| JP | 2009-093101 A | 4/2009 |
| JP | 2015-015433 A | 1/2015 |

\* cited by examiner

OPTICAL MODULE

TECHNICAL FIELD

The present invention relates to an optical module.

BACKGROUND ART

There are known optical modules that include semiconductor light-emitting devices within packages (for example, refer to Patent Literatures 1 to 4). Such optical modules are used as light sources of various apparatuses such as display apparatuses, optical pickup apparatuses, and optical communication apparatuses.

CITATION LIST

Patent Literature

PTL 1: Japanese Unexamined Patent Application Publication No. 2009-93101
PTL 2: Japanese Unexamined Patent Application Publication No. 2007-328895
PTL 3: Japanese Unexamined Patent Application Publication No. 2007-17925
PTL 4: Japanese Unexamined Patent Application Publication No. 2007-65600

SUMMARY OF INVENTION

Technical Problem

In order to further increase the use of such optical modules and increase the range of applications of such optical modules, a reduction in the size of optical modules is important. On the other hand, optical modules are provided, depending on their applications, so as to include optical coupling components such as various lenses and pigtails. However, a reduction in the size of optical modules places a limitation on attachment positions for such optical coupling components and hinders flexible design of the configurations of optical modules, which is problematic.

Accordingly, an object is to provide an optical module that enables a reduction in the size and also flexible design of the configuration.

Solution to Problem

An optical module according to the present invention includes a light-forming part configured to form light; a protective member that includes an output window configured to transmit light from the light-forming part and that is disposed so as to surround the light-forming part; an adapter connected to the protective member and including an optical passage through which light emitted from the light-forming part and transmitted by the output window passes; and an optical coupling component that is connected to the adapter and that light passing through the optical passage enters. The light-forming part includes a semiconductor light-emitting device, and a lens configured to convert, in terms of spot size, light emitted from the semiconductor light-emitting device. The optical coupling component includes an optical component, and a support member supporting the optical component. The support member and the adapter are connected together.

Advantageous Effects of Invention

The above-described optical module enables a reduction in the size and also flexible design of the configuration.

DESCRIPTION OF EMBODIMENTS

Figure 1:
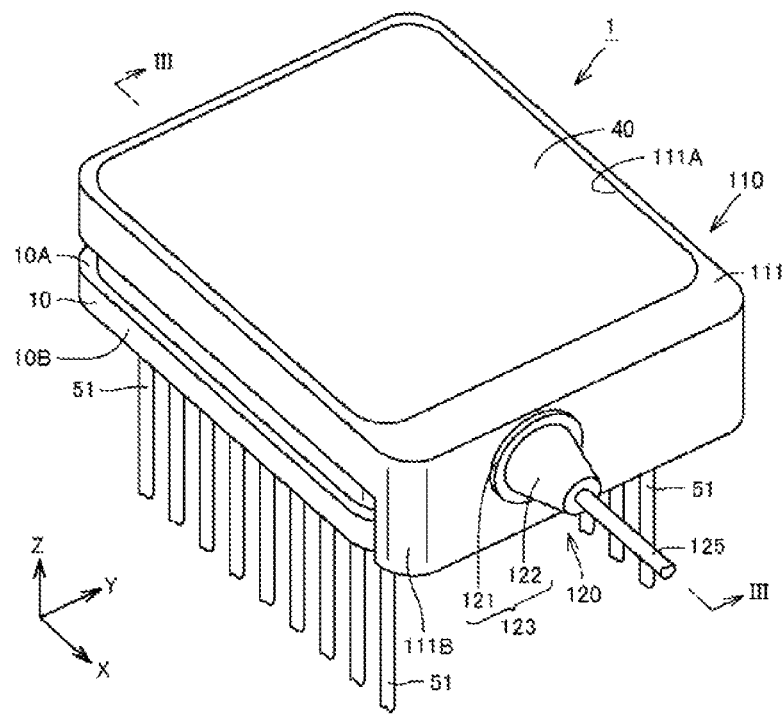
FIG. 1 is a schematic perspective view illustrating the structure of an optical module according to Embodiment 1.

Description of Embodiments According to Invention of the Present Application Embodiments according to the invention of the present application will be first listed and described. An optical module according to the present application includes a light-forming part configured to form light; a protective member that includes an output window configured to transmit light from the light-forming part and that is disposed so as to surround the light-forming part; an adapter connected to the protective member and including an optical passage through which light emitted from the light-forming part and transmitted by the output window passes; and an optical coupling component that is connected to the adapter and that light passing through the optical passage enters. The light-forming part includes a semiconductor light-emitting device, and a lens configured to convert, in terms of spot size, light emitted from the semiconductor light-emitting device. The optical coupling component includes an optical component, and a support member supporting the optical component. The support member and the adapter are connected together.

An optical module according to the present application has a structure in which a light-forming part including a semiconductor light-emitting device and a lens is surrounded by a single protective member. In other words, the optical module has a structure in which a semiconductor light-emitting device and a lens are mounted within a single package. A reduction in the size of such an optical module places a limitation on attachment positions for additional optical coupling components (such as a pigtail and a lens). For this reason, it may become difficult to attach additional optical coupling components. In an optical module according to the present application, an adapter including an optical passage through which light from the light-forming part passes is connected to the protective member; and, to the adapter, a support member of an optical coupling component is connected. Such a structure of supporting the optical coupling component via the adapter connected to the protective member is employed to thereby provide, without considerably inhibiting a reduction in the size of the optical module, the optical module that includes a desired additional optical coupling component. Therefore, an optical module according to the present application enables a reduction in the size and also flexible design of the configuration.

In the above-described optical module, the protective member and the adapter may be connected together by welding. This configuration enables a strong connection between the protective member and the adapter.

In the above-described optical module, the support member and the adapter may be connected together by welding. This configuration enables a strong connection between the support member and the adapter.

In the above-described optical module, the light-forming part may be hermetically sealed with the protective member. This configuration enables an increase in the longevity of the semiconductor light-emitting device.

In the above-described optical module, the semiconductor light-emitting device may be configured to emit infrared light. This configuration enables the optical module to be usable for, for example, sensing applications.

In the above-described optical module, the light-forming part may include a plurality of the semiconductor light-emitting devices, a plurality of the lenses individually disposed so as to correspond to the plurality of semiconductor light-emitting devices, and a filter configured to multiplex light from the plurality of semiconductor light-emitting devices.

In this case, plural semiconductor light-emitting devices are disposed within a single package, and light from these semiconductor light-emitting devices can be multiplexed within the package. This configuration enables a reduction in the size of an apparatus including the optical module, compared with a case of multiplexing light from plural packages.

Incidentally, examples of the filter include wavelength selective filters and polarization synthesizing filters.

In the above-described optical module, the plurality of semiconductor light-emitting devices may include a semiconductor light-emitting device configured to emit red light, a semiconductor light-emitting device configured to emit green light, and a semiconductor light-emitting device configured to emit blue light. This configuration enables multiplexing of such light to form light of a desired color.

In the above-described optical module, the semiconductor light-emitting device may be a laser diode.

This configuration enables emitted light having less variation in the wavelength.

Details of Embodiments According to Invention of the Present Application

Embodiment 1

Figure 2:
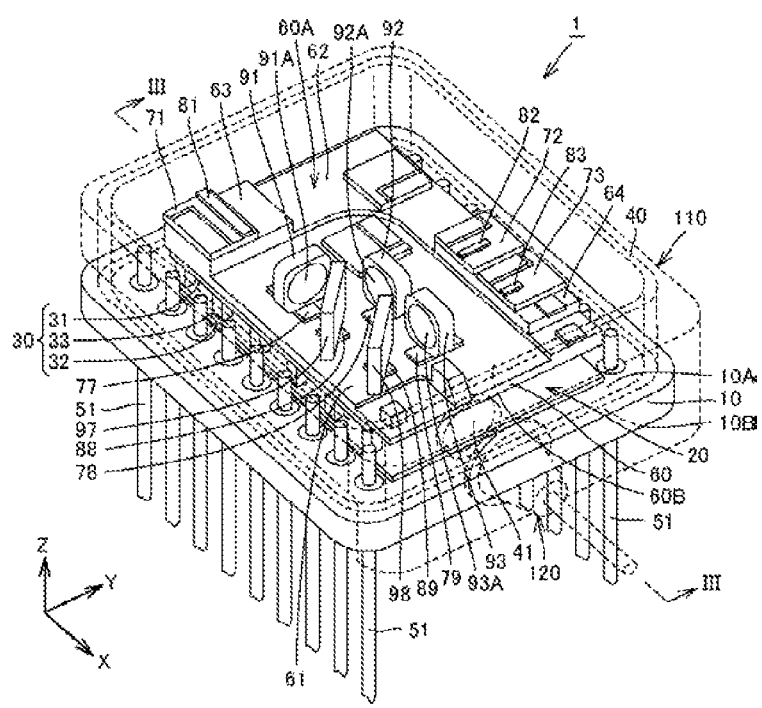
FIG. 2 is a schematic perspective view illustrating the structure of an optical module according to Embodiment 1.
Figure 3:
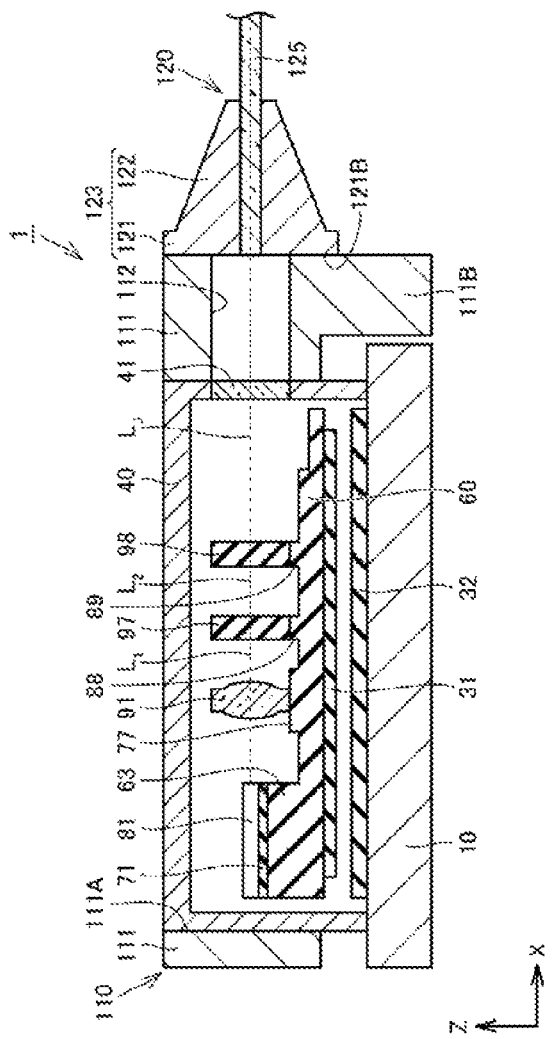
FIG. 3 is a schematic sectional view illustrating the structure of an optical module according to Embodiment 1.
Figure 4:
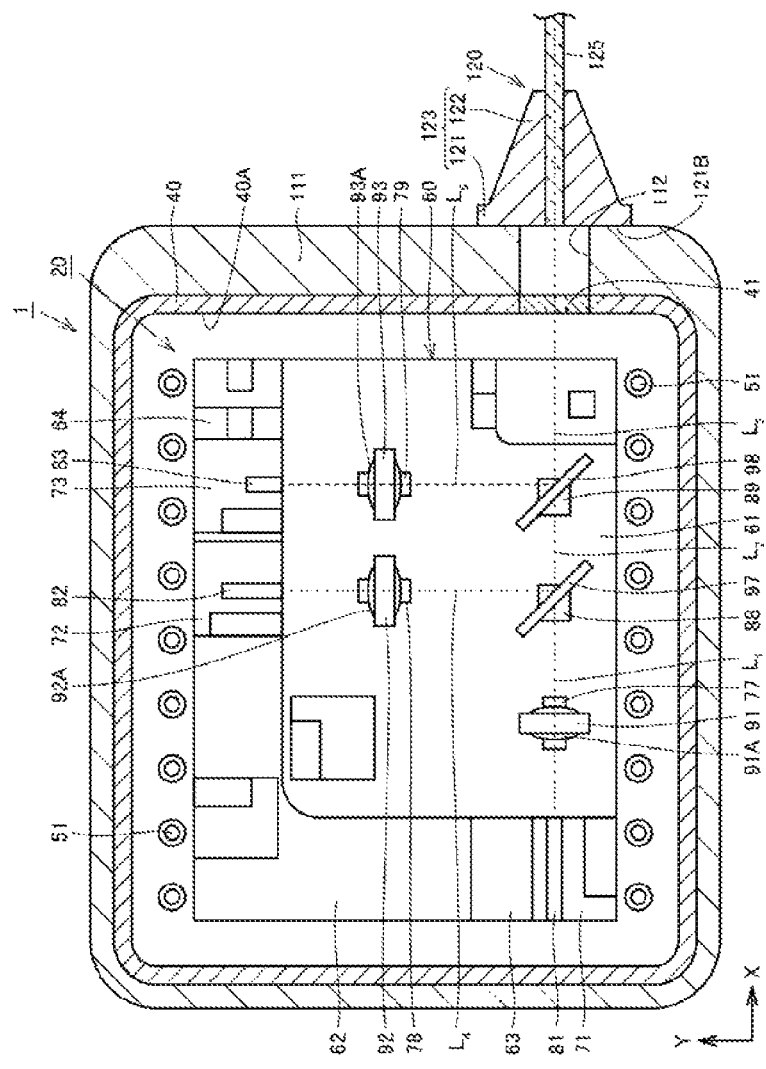
FIG. 4 is a schematic view illustrating the structure of an optical module according to Embodiment 1.

Hereinafter, Embodiment 1, which relates to an optical module according to an embodiment of the present invention, will be described with reference to drawings. FIG. 2 corresponds to a state in which a cap 40, an adapter 110, and a pigtail 120 in FIG. 1 are detached. FIG. 3 corresponds to a section taken along lines III-III in FIG. 1 and FIG. 2. FIG. 4 illustrates the planar structure of a light-forming part and sections of the adapter and the pigtail, the sections being taken along a plane parallel to the main surfaces of the base plate of the light-forming part.

In the drawings below, like or corresponding elements are denoted by like reference numerals and redundant descriptions thereof will be omitted.

Referring to FIG. 1 to FIG. 3, an optical module 1 according to this embodiment includes a stem 10 having the shape of a flat plate; a light-forming part 20 disposed on one main surface 10A of the stem 10 and configured to form light; a cap 40 disposed on and in contact with the one main surface 10A of the stem 10 so as to cover the light-forming part 20; and plural lead pins 51 that extend through the stem 10 from the other main surface 10B side to the one main surface 10A side and protrude from both of the one main surface 10A and the other main surface 10B. The stem 10 and the cap 40 are, for example, welded together to provide a hermetically sealed state. In other words, the light-forming part 20 is hermetically sealed with the stem 10 and the cap 40. The space surrounded by the stem 10 and the cap 40 contains, for example, a gas having a reduced water content (moisture is removed), such as dry air. The cap 40 has an output window 41, which transmits light from the light-forming part 20. The output window 41 may have the shape of a flat plate whose main surfaces are parallel to each other, or may have the shape of a lens that condenses or diffuses light from the light-forming part 20. The stem 10 and the cap 40 constitute a protective member. The stem 10 and the cap 40 have the shapes of rectangles when viewed in plan.

The optical module 1 further includes the adapter 110, which is connected to the cap 40 serving as the protective member and which includes an optical passage 112 through which light emitted from the light-forming part 20 and transmitted by the output window 41 passes; and the pigtail 120, which is an optical coupling component that is connected to the adapter 110 and that light passing through the optical passage 112 enters.

Referring to FIG. 1, the adapter 110 includes a loop-shaped body part 111. The body part 111 has an inner peripheral surface 111A, which has a shape corresponding to the outer peripheral surface (surface extending in a direction so as to intersect the one main surface 10A of the stem 10) of the cap 40. A region surrounded by the inner peripheral surface 111A of the body part 111 has the shape of a rectangle when viewed in plan. A region surrounded by the outer peripheral surface of the body part 111 has the shape of a rectangle when viewed in plan. In a region corresponding to one of the sides of the rectangular planar shape of the body part 111, an overhang region 111B is formed so as to overhang in a direction intersecting (in a direction perpendicular to) the one main surface 10A of the stem 10. In the region of the body part 111 corresponding to the overhang region 111B, the optical passage 112 is formed, which is a through-hole that extends from the outer peripheral surface to the inner peripheral surface 111A. The outer peripheral surface of the body part 111 corresponding to the overhang region 111B functions as an attachment surface to which the pigtail 120 is attached as an optical coupling component. The adapter 110 is disposed such that the inner peripheral surface 111A of the body part 111 surrounds the outer peripheral surface of the cap 40. The adapter 110 is disposed such that the optical passage 112 is positioned in a region corresponding to the output window 41. In this embodiment, the inner peripheral surface 111A of the body part 111 of the adapter 110 and the outer peripheral surface of the cap 40 are bonded together by welding. The welding may be performed by YAG (Yttrium Aluminium Garnet) laser welding, for example.

The pigtail 120 includes a fiber (optical fiber waveguide) 125 and a support member 123, which supports the fiber 125. The support member 123 includes a base part 121, which has the shape of a disc, and a body part 122, which is connected to one of the end surfaces of the base part 121 and has the shape of a truncated cone. The body part 122 is disposed with respect to the base part 121 such that the central axis of the base part 121 and the central axis of the body part 122 align with each other. In a region including the central axes of the base part 121 and the body part 122, a through-hole is formed so as to extend through the base part 121 and the body part 122 in their axial direction. In this through-hole, the fiber 125 is inserted. In other words, the fiber 125 is inserted, along the region including the central axes of the base part 121 and the body part 122, into the support member 123. As a result, the fiber 125 is supported by the support member 123. The pigtail 120 is disposed such that an end surface of the fiber 125 is positioned in a region corresponding to the optical passage 112. In this embodiment, the other end surface 121B of the base part 121 of the support member 123 and the outer peripheral surface of the body part 111 of the adapter 110 are bonded together by welding. The welding may be performed by spot welding, for example.

Referring to FIG. 2 to FIG. 4, the light-forming part 20 includes a base plate 60, which is a base member having the shape of a plate. The base plate 60 has one main surface 60A, which has a rectangular shape when viewed in plan. The base plate 60 includes a base region 61 and a chip mount region 62. The chip mount region 62 is formed in a region including one short side of the one main surface 60A and one long side connected to the one short side. The chip mount region 62 has a larger thickness than the base region 61. As a result, the chip mount region 62 has a larger height than the base region 61. The chip mount region 62 includes a first chip mount region 63, which is formed in a region on an end side of the one short side opposite to the other end side where the one short side is connected to the one long side, and which has a larger thickness (larger height) than the adjacent region. The chip mount region 62 includes a second chip mount region 64, which is formed in a region on an end side of the one long side opposite to the other end side where the one long side is connected to the one short side, and which has a larger thickness (larger height) than the adjacent region.

On the first chip mount region 63, a first submount 71 having the shape of a flat plate is disposed. On the first submount 71, a red laser diode 81 is disposed as a first semiconductor light-emitting device. On the other hand, on the second chip mount region 64, a second submount 72 and a third submount 73 each having the shape of a flat plate are disposed. When viewed from the second submount 72, the third submount 73 is disposed on an end side opposite to the other end side where the one long side and the one short side are connected together. On the second submount 72, a green laser diode 82 is disposed as a second semiconductor light-emitting device. On the third submount 73, a blue laser diode 83 is disposed as a third semiconductor light-emitting device. The heights of the optical axes of the red laser diode 81, the green laser diode 82, and the blue laser diode 83 (the distances between each optical axis and a reference surface that is the one main surface 60A of the base plate 60; the distances from the reference surface in the Z-axis direction) are adjusted to be the same by means of the first submount 71, the second submount 72, and the third submount 73.

On the base region 61 of the base plate 60, a first lens support part 77, a second lens support part 78, and a third lens support part 79, which are protrusion parts, are formed. On the first lens support part 77, the second lens support part 78, and the third lens support part 79, a first lens 91, a second lens 92, and a third lens 93 are respectively disposed. The first lens 91, the second lens 92, and the third lens 93 have lens portions 91A, 92A, and 93A whose surfaces are lens surfaces. The first lens 91, the second lens 92, and the third lens 93 are each molded in one piece in terms of the lens portions 91A, 92A, and 93A and regions other than the lens portions 91A, 92A, and 93A. The first lens 91, the second lens 92, and the third lens 93 may be formed of glass or may be formed of resin. The first lens support part 77, the second lens support part 78, and the third lens support part 79 are used to adjust the central axes of the lens portions 91A, 92A, and 93A of the first lens 91, the second lens 92, and the third lens 93, that is, the optical axes of the lens portions 91A, 92A, and 93A, so as to respectively align with the optical axes of the red laser diode 81, the green laser diode 82, and the blue laser diode 83. The first lens 91, the second lens 92, and the third lens 93 respectively convert, in terms of spot size, light emitted from the red laser diode 81, the green laser diode 82, and the blue laser diode 83. The first lens 91, the second lens 92, and the third lens 93 are used to convert, in terms of spot size, light emitted from the red laser diode 81, the green laser diode 82, and the blue laser diode 83, such that the resultant spot sizes are the same.

On the base region 61 of the base plate 60, a first filter 97 and a second filter 98 are disposed. The first filter 97 and the second filter 98 each have the shape of a flat plate whose main surfaces are parallel to each other. The first filter 97 and the second filter 98 are wavelength selective filters, for example. The first filter 97 and the second filter 98 are dielectric multilayer film filters. More specifically, the first filter 97 transmits red light, but reflects green light. The second filter 98 transmits red light and green light, but reflects blue light.

As described above, the first filter 97 and the second filter 98 selectively transmit and reflect light of specific wavelengths. As a result, the first filter 97 and the second filter 98 multiplex light emitted from the red laser diode 81, the green laser diode 82, and the blue laser diode 83. The first filter 97 and the second filter 98 are respectively disposed on a first protrusion region 88 and a second protrusion region 89, which are protrusion parts formed on the base region 61.

Referring to FIG. 4, the red laser diode 81, the lens portion 91A of the first lens 91, the first filter 97, and the second filter 98 are disposed so as to be arranged in a line extending in the emission direction of light from the red laser diode 81 (arranged in the X-axis direction). The green laser diode 82, the lens portion 92A of the second lens 92, and the first filter 97 are disposed so as to be arranged in a line extending in the emission direction of light from the green laser diode 82 (arranged in the Y-axis direction). The blue laser diode 83, the lens portion 93A of the third lens 93, and the second filter 98 are disposed so as to be arranged in a line extending in the emission direction of light from the blue laser diode 83 (arranged in the Y-axis direction). Thus, the emission direction of the red laser diode 81 intersects the emission directions of the green laser diode 82 and the blue laser diode 83. More specifically, the emission direction of the red laser diode 81 is orthogonal to the emission directions of the green laser diode 82 and the blue laser diode 83. The emission direction of the green laser diode 82 corresponds to the emission direction of the blue laser diode 83. More specifically, the emission direction of the green laser diode 82 is parallel to the emission direction of the blue laser diode 83. The main surfaces of the first filter 97 and the second filter 98 incline with respect to the emission direction of light from the red laser diode 81. More specifically, the main surfaces of the first filter 97 and the second filter 98 incline at 45° with respect to the emission direction of light from the red laser diode 81 (the X-axis direction).

Referring to FIG. 2, the light-forming part 20 includes an electronic cooling module 30. The electronic cooling module 30 is disposed between the stem 10 and the base plate 60. The electronic cooling module 30 includes a heat absorption plate 31, a heat dissipation plate 32, and semiconductor columns 33 arranged between electrodes disposed on the heat absorption plate 31 and on the heat dissipation plate 32. The heat absorption plate 31 and the heat dissipation plate 32 are formed of alumina, for example. The heat absorption plate 31 is disposed in contact with the other main surface 60B of the base plate 60. The heat dissipation plate 32 is disposed in contact with the one main surface 10A of the stem 10. In this embodiment, the electronic cooling module 30 is a Peltier module (Peltier device). A current is passed through the electronic cooling module 30, so that heat in the base plate 60, which is in contact with the heat absorption plate 31, is transferred to the stem 10, which results in cooling of the base plate 60. As a result, changes in the temperatures of the red laser diode 81, the green laser diode 82, the blue laser diode 83, the first lens 91, the second lens 92, the third lens 93, and the like are suppressed. Such an electronic cooling module is not an essential element in the optical module according to the present application. However, in this embodiment, the electronic cooling module 30 is included; and this enables suppression of, for example, changes in the wavelengths of light emitted from the red laser diode 81, the green laser diode 82, and the blue laser diode 83 due to changes in the temperatures, and changes in the refractive indexes of the first lens 91, the second lens 92, and the third lens 93 due to changes in the temperatures.

Hereinafter, operations of the optical module 1 according to this embodiment will be described. Referring to FIG. 3 and FIG. 4, red light emitted from the red laser diode 81 travels along an optical path $L_1$ and enters the lens portion 91A of the first lens 91, so that the light is converted in terms of spot size. Specifically, for example, red light emitted from the red laser diode 81 is converted into collimated light. The red light having been converted in terms of spot size at the first lens 91, travels along the optical path $L_1$, and enters the first filter 97. The first filter 97 transmits red light, so that the light emitted from the red laser diode 81 further travels along an optical path $L_2$, and enters the second filter 98. The second filter 98 transmits red light, so that the light emitted from the red laser diode 81 further travels along an optical path $L_3$, and is outputted through the output window 41 of the cap 40 to the outside of the protective member.

Green light emitted from the green laser diode 82 travels along an optical path $L_4$, enters the lens portion 92A of the second lens 92, so that the light is converted in terms of spot size. Specifically, for example, the green light emitted from the green laser diode 82 is converted into collimated light. The green light having been converted in terms of spot size at the second lens 92, travels along the optical path $L_4$, and enters the first filter 97. The first filter 97 reflects green light, so that the light emitted from the green laser diode 82 joins the optical path $L_2$. As a result, the green light is multiplexed with the red light, travels along the optical path $L_2$, and enters the second filter 98. The second filter 98 transmits green light, so that the light emitted from the green laser diode 82 further travels along the optical path $L_3$, and is outputted through the output window 41 of the cap 40 to the outside of the protective member.

Blue light emitted from the blue laser diode 83 travels along an optical path $L_5$ and enters the lens portion 93A of the third lens 93, so that the light is converted in terms of spot size. Specifically, for example, the blue light emitted from the blue laser diode 83 is converted into collimated light. The blue light having been converted in terms of spot size at the third lens 93, travels along the optical path $L_5$, and enters the second filter 98. The second filter 98 reflects blue light, so that the light emitted from the blue laser diode 83 joins the optical path $L_3$. As a result, the blue light is multiplexed with the red light and the green light, travels along the optical path $L_3$, and is outputted through the output window 41 of the cap 40 to the outside of the protective member.

In this way, light formed by multiplexing red light, green light, and blue light is outputted through the output window 41 of the cap 40. Referring to FIG. 3 and FIG. 4, the light outputted through the output window 41 passes through the optical passage 112 of the adapter 110 and enters the fiber 125 of the pigtail 120. The light having entered the fiber 125 passes through the fiber 125, which is a waveguide, to thereby be guided to a desired place.

In the optical module 1 according to this embodiment, the adapter 110, which includes the optical passage 112 through which light from the light-forming part 20 passes, is connected to the cap 40; and, to the adapter 110, the support member 123 of the pigtail 120 serving as an optical coupling component is connected. Such a structure of supporting the optical coupling component via the adapter 110, which is connected to the cap 40 serving as a protective member, is employed to thereby provide, without considerably inhibiting a reduction in the size of the optical module 1, the optical module 1 including the pigtail 120, which is a desired additional optical coupling component. Thus, the optical module 1 according to this embodiment enables a reduction in the size and also flexible design of the configuration.

Embodiment 2

Figure 5:
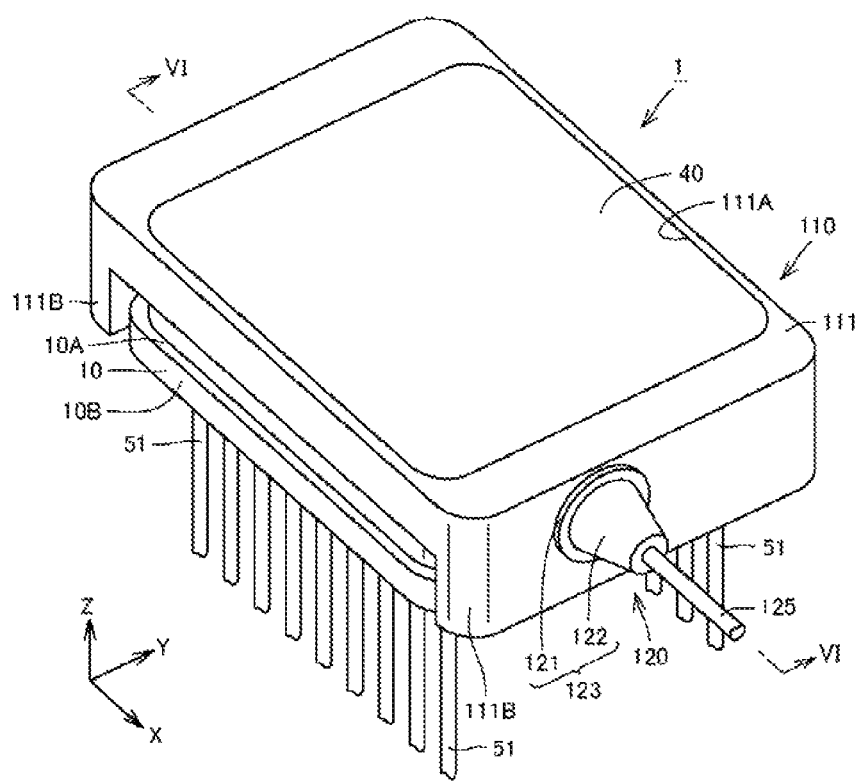
FIG. 5 is a schematic perspective view illustrating the structure of an optical module according to Embodiment 2.
Figure 6:
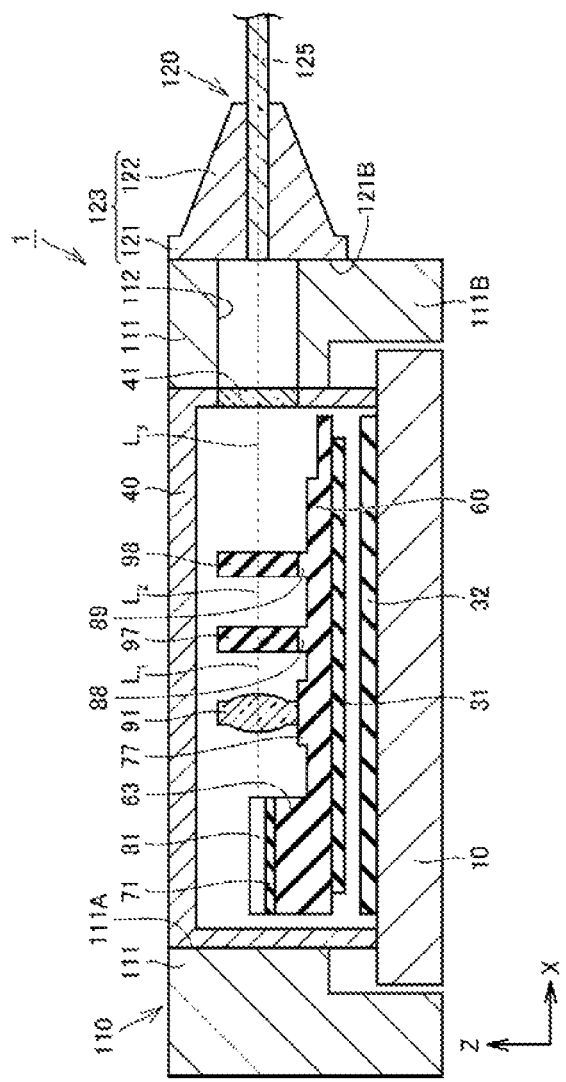
FIG. 6 is a schematic sectional view illustrating the structure of an optical module according to Embodiment 2.

Hereinafter, Embodiment 2, which relates to an optical module according to another embodiment of the present invention, will be described. FIG. 5 is a schematic perspective view illustrating the structure of an optical module according to Embodiment 2. FIG. 6 is a schematic sectional view taken along line VI-VI in FIG. 5. FIGS. 5 and 6 correspond to FIGS. 1 and 3 in Embodiment 1 described above. Referring to FIGS. 5 and 6 and FIGS. 1 and 3, an optical module 1 according to this embodiment basically has the same structure and provides the same advantages as in Embodiment 1. However, the optical module 1 according to Embodiment 2 is different from Embodiment 1 in terms of the structure of the adapter 110.

Specifically, referring to FIG. 5 and FIG. 6, the adapter 110 of the optical module 1 according to Embodiment 2 includes a pair of overhang regions 111B. In other words, in a region corresponding to one of the sides of the rectangular planar shape of the body part 111, and in a region corresponding to another side (a side parallel to the one side) facing the one side, the overhang regions 111B are formed so as to overhang in a direction intersecting (a direction perpendicular to) the one main surface 10A of the stem 10. The additionally formed overhang region can be used as, for example, a region for fixing the optical module 1 to another member (for example, a region for connection with a stud pin), or a region to which a cooling member is attached for cooling the optical module 1 (for example, an attachment region for a heat sink).

Embodiment 3

Figure 7:
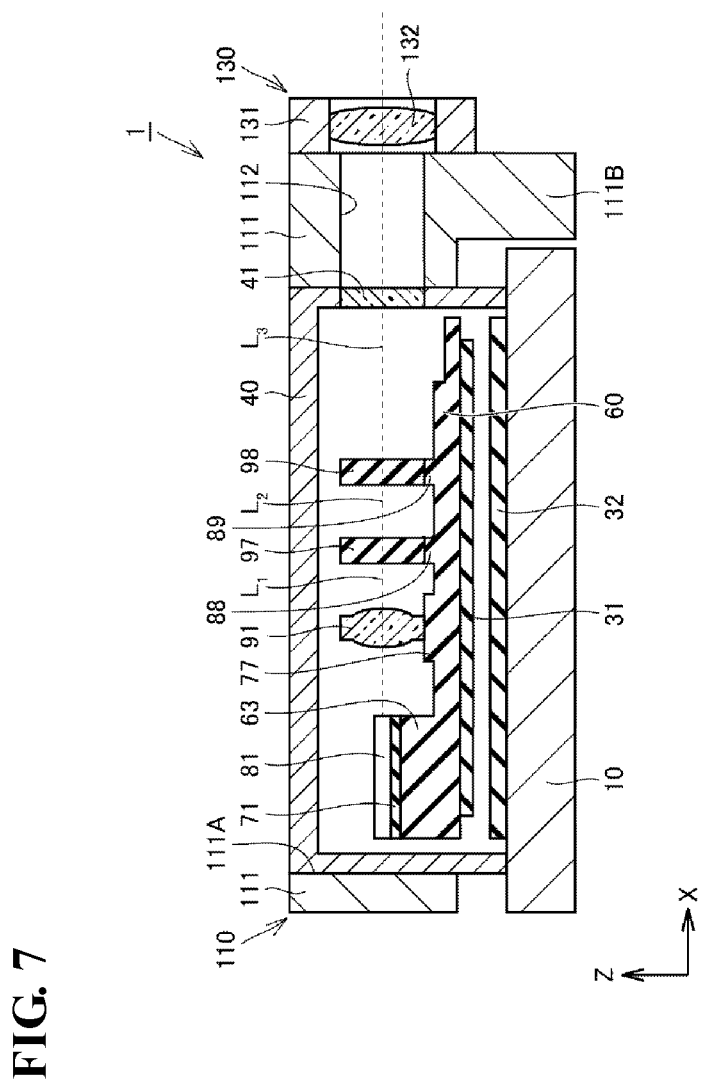
FIG. 7 is a schematic sectional view illustrating the structure of an optical module according to Embodiment 3.
Figure 8:
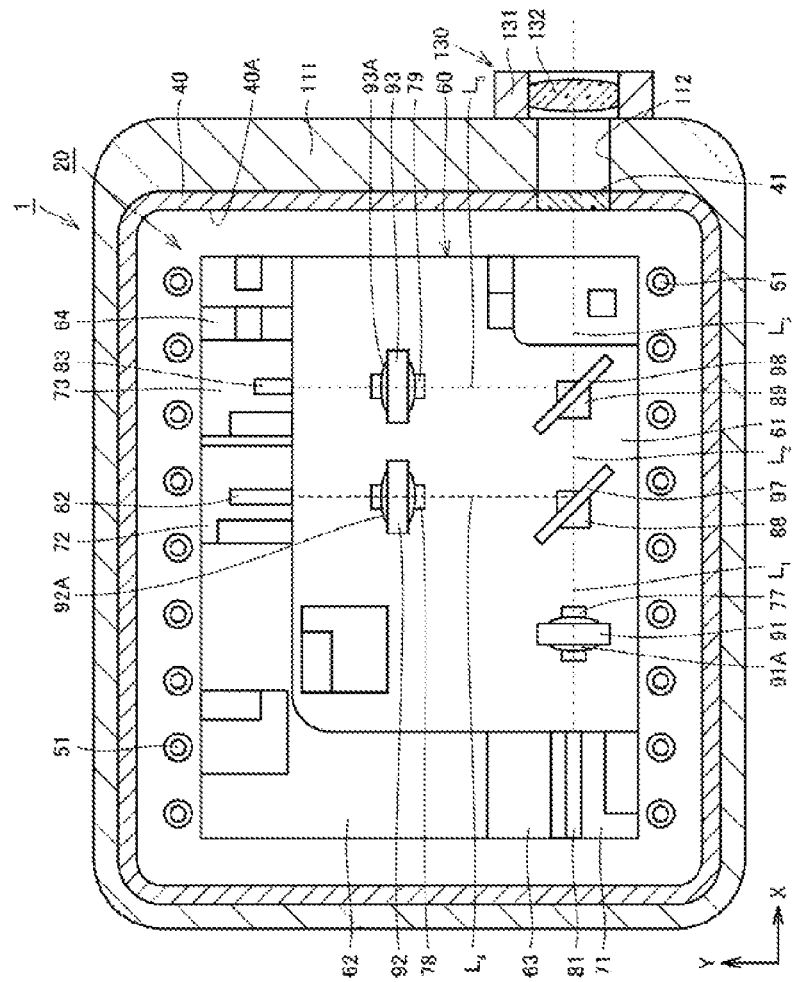
FIG. 8 is a schematic view illustrating the structure of an optical module according to Embodiment 3.

Hereinafter, Embodiment 3, which relates to an optical module according to another embodiment of the present invention, will be described. FIGS. 7 and 8 respectively correspond to FIGS. 3 and 4 in the above-described embodiment.

Referring to FIGS. 7 and 8 and FIGS. 3 and 4, an optical module 1 according to this embodiment basically has the same structure and provides the same advantages as in Embodiment 1. However, the optical module 1 according to Embodiment 3 is different from Embodiment 1 in that an optical coupling component that is a lens component 130 instead of the pigtail 120 is connected to the adapter 110.

Referring to FIG. 7 and FIG. 8, the optical module 1 according to Embodiment 3 includes the lens component 130, which is an optical coupling component that is connected to the adapter 110 and that light passing through the optical passage 112 enters. The lens component 130 includes a lens 132 and a support member 131, which supports the lens 132 so as to surround the outer peripheral surface of the lens 132. The lens 132 is a collimating lens, for example. The support member 131 has the shape of a cylinder and, by means of its inner peripheral surface, supports the lens 132. The lens component 130 is disposed such that the incident surface of the lens 132 is positioned in a region corresponding to the optical passage 112. In this embodiment, one of the end surfaces of the support member 131 and the outer peripheral surface of the body part 111 of the adapter 110 are bonded together by welding.

The welding may be performed by spot welding, for example.

Referring to FIG. 7 and FIG. 8, in the optical module 1 according to this embodiment, light outputted through the output window 41 passes through the optical passage 112 of the adapter 110, and enters the lens 132 of the lens component 130. The light having entered the lens 132 is subjected to spot-conversion, and is outputted through the lens 132 to the outside of the optical module 1.

Embodiment 4

Figure 9:
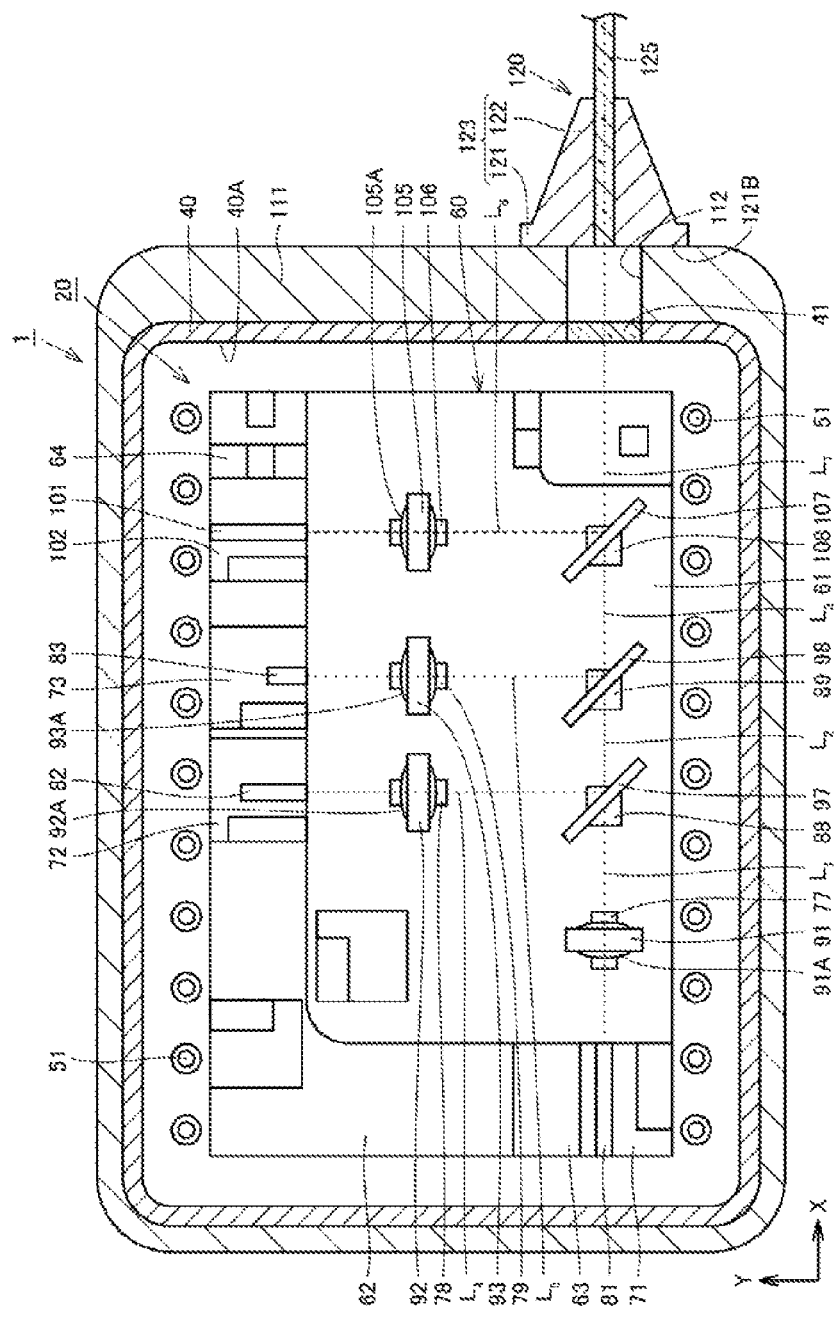
FIG. 9 is a schematic view illustrating the structure of an optical module according to Embodiment 4.

Hereinafter, Embodiment 4, which relates to an optical module according to another embodiment of the present invention, will be described. FIG. 9 illustrates, in Embodiment 4, the planar configuration of a light-forming part and sections of an adapter and a pigtail, the sections being taken along a plane parallel to the main surfaces of the base plate of the light-forming part. FIG. 9 corresponds to FIG. 4 in Embodiment 1. Referring to FIG. 9 and FIG. 4, an optical module 1 according to this embodiment basically has the same structure and provides the same advantages as in Embodiment 1. However, the optical module 1 according to Embodiment 4 is different from Embodiment 1 in that the light-forming part 20 further includes an infrared laser diode 101 as a fourth semiconductor light-emitting device. Hereafter, the difference of Embodiment 4 from Embodiment 1 will be described.

Referring to FIG. 9, in Embodiment 4, a fourth submount 102 having the shape of a flat plate is disposed on the second chip mount region 64 formed on the base plate 60. When viewed from the third submount 73, the fourth submount 102 is disposed on a side opposite to the second submount 72. On the fourth submount 102, the infrared laser diode 101 serving as the fourth semiconductor light-emitting device is disposed. The infrared laser diode 101 emits infrared light. The wavelengths of infrared light emitted from the infrared laser diode 101 are not particularly limited. The infrared laser diode 101 may emit, for example, infrared light in the 700 nm band suitable for sensing person's motion, or infrared light in the 1100 nm band or the 1700 nm band suitable for sensing substances. The height of the optical axis of the infrared laser diode 101 is adjusted by means of the fourth submount 102, so as to be the same as the heights of the optical axes of the red laser diode 81, the green laser diode 82, and the blue laser diode 83.

On the base region 61 of the base plate 60, a fourth lens support part 106, which is a protrusion part, is formed. On the fourth lens support part 106, a fourth lens 105 is disposed.

The fourth lens 105 has a lens portion 105A whose surfaces are lens surfaces. The fourth lens 105 is molded in one piece in terms of the lens portion 105A and a region other than the lens portion 105A. As with the first lens 91, the second lens 92, and the third lens 93, the fourth lens 105 may be formed of glass or may be formed of resin. Changes in the temperatures of the fourth lens 105 in addition to the first lens 91, the second lens 92, and the third lens 93 are suppressed by means of an electronic cooling module 30 having the same configuration as in Embodiment 1. The fourth lens support part 106 is used to adjust the central axis of the lens portion 105A of the fourth lens 105, that is, the optical axis of the lens portion 105A, so as to align with the optical axis of the infrared laser diode 101. The fourth lens 105 converts, in terms of spot size, light emitted from the infrared laser diode 101. The fourth lens 105 is used to convert the light emitted from the infrared laser diode 101, so as to have the same spot size as the light emitted from the red laser diode 81, the green laser diode 82, and the blue laser diode 83 and individually converted by the corresponding lenses.

On the base region 61 of the base plate 60, a third filter 107 is disposed. The third filter 107 has the shape of a flat plate whose main surfaces are parallel to each other. The third filter 107 is a wavelength selective filter, for example. The third filter 107 is a dielectric multilayer film filter. The third filter 107 transmits red light, green light, and blue light, but reflects infrared light emitted from the infrared laser diode 101. As a result, the first filter 97, the second filter 98, and the third filter 107 multiplex light emitted from the red laser diode 81, the green laser diode 82, the blue laser diode 83, and the infrared laser diode 101. The third filter 107 is disposed on a third protrusion region 108, which is a protrusion part formed on the base region 61.

Referring to FIG. 9, the infrared laser diode 101, the lens portion 105A of the fourth lens 105, and the third filter 107 are disposed so as to be arranged in a line extending in the emission direction of light from the infrared laser diode 101 (arranged in the Y-axis direction). Thus, the emission direction of the red laser diode 81 intersects the emission directions of the green laser diode 82, the blue laser diode 83, and the infrared laser diode 101. More specifically, the emission direction of the red laser diode 81 is orthogonal to the emission directions of the green laser diode 82, the blue laser diode 83, and the infrared laser diode 101. The emission direction of the infrared laser diode 101 corresponds to the emission directions of the green laser diode 82 and the blue laser diode 83. More specifically, the emission direction of the infrared laser diode 101, the emission direction of the green laser diode 82, and the emission direction of the blue laser diode 83 are parallel to each other. The main surfaces of the third filter 107 incline with respect to the emission direction of light from the red laser diode 81. More specifically, the main surfaces of the third filter 107 incline at 45° with respect to the emission direction of light from the red laser diode 81 (the X-axis direction).

Hereinafter, operations of the optical module 1 according to this embodiment will be described. The optical module 1 according to this embodiment basically operates as in Embodiment 1. Hereafter, differences from Embodiment 1 will be described. Referring to FIG. 9, the infrared light emitted from the infrared laser diode 101 travels along an optical path $L_6$ and enters the lens portion 105A of the fourth lens 105, so that the light is converted in terms of spot size. Specifically, for example, the infrared light emitted from the infrared laser diode 101 is converted into collimated light. The infrared light having been converted in terms of spot size at the fourth lens 105, travels along the optical path $L_6$, and enters the third filter 107. The third filter 107 transmits red light, green light, and blue light, but reflects infrared light. Thus, the red light, the green light, and the blue light multiplexed as in Embodiment 1 and transmitted by the third filter 107, are multiplexed with the infrared light reflected by the third filter 107, further travel along an optical path $L_7$, and are outputted through the output window 41 of the cap 40 to the outside of the protective member. Referring to FIG. 9, the light outputted through the output window 41 passes through the optical passage 112 of the adapter 110 and enters the fiber 125 of the pigtail 120. The light having entered the fiber 125 passes through the fiber 125, which is a waveguide, to thereby be guided to a desired place.

In the optical module 1 according to this embodiment, red light, green light, and blue light and also infrared light are multiplexed and emitted from the optical module 1. For this reason, for example, visible light for image displaying and infrared light for sensing can be emitted from a single optical module 1. Thus, the optical module 1 can be used as, for example, a light source that senses a position of a person's finger and simultaneously provides visual presentation on the basis of the sensing result.

Incidentally, examples of the material forming the base plate 60 and the stem 10 serving as a protective member include iron alloys and copper alloys that are materials having high thermal conductivity. The submounts 71, 72, 73, and 102 are formed of a material that has a thermal expansion coefficient similar to the thermal expansion coefficients of the laser diodes 81, 82, 83, and 101 mounted on the submounts 71, 72, 73, and 102. Examples of the material include AlN, SiC, Si, and diamond.

The above-described embodiments relate to cases in which the pigtail and the lens component serving as examples of the optical coupling component are connected to the adapters. However, the optical coupling component connected to the adapter is not limited to such examples and may be another optical coupling component such as a diffusing plate. The above-described embodiments relate to cases of multiplexing light from three or four semiconductor light-emitting devices having different emission wavelengths. Alternatively, the number of semiconductor light-emitting devices may be one or two, or five or more. The above-described embodiments relate to cases where all the semiconductor light-emitting devices included in the light-forming part are configured to emit visible light and a case where the light-forming part includes semiconductor light-emitting devices configured to emit visible light and a semiconductor light-emitting device configured to emit infrared light. Alternatively, all the semiconductor light-emitting devices included in the light-forming part may be configured to emit infrared light. The above-described embodiments relate to cases of employing laser diodes as semiconductor light-emitting devices. Alternatively, the semiconductor light-emitting devices may be light-emitting diodes, for example. The above-described embodiments relate to example cases of employing wavelength selective filters as the first filter 97, the second filter 98, and the third filter 107. Alternatively, these filters may be polarization synthesizing filters, for example.

Embodiments disclosed herein are mere examples in all respects and should be understood as placing no limitations in any perspective. The scope of the present invention is defined not by the above-described description, but by Claims. The scope of the present invention is intended to embrace all the modifications within the meaning and range of equivalency of the Claims.

The invention claimed is:
1. An optical module comprising:
a light-forming part configured to form light;
a protective member that includes an output window configured to transmit light from the light-forming part and that is disposed so as to surround the light-forming part;
an adapter connected to the protective member and including an optical passage through which light emitted from the light-forming part and transmitted by the output window passes; and
an optical coupling component that is connected to the adapter and that light passing through the optical passage enters,
wherein the light-forming part includes
a semiconductor light-emitting device, and
a lens configured to convert, in terms of spot size, light emitted from the semiconductor light-emitting device,
wherein the optical coupling component includes
an optical component, and
a support member supporting the optical component,
wherein the support member and the adapter are connected together,
wherein the adapter includes a loop-shaped body part having an outer peripheral surface and an inner peripheral surface, the inner peripheral surface surrounding the protective member, and
wherein the optical passage extends from the outer peripheral surface to the inner peripheral surface of the loop-shaped body part.

2. The optical module according to claim 1, wherein the protective member and the adapter are connected together by welding.

3. The optical module according to claim 1, wherein the support member and the adapter are connected together by welding.

4. The optical module according claim 1, wherein the light-forming part is hermetically sealed with the protective member.

5. The optical module according to claim 1, wherein the semiconductor light-emitting device is configured to emit infrared light.

6. The optical module according to claim 1, wherein the light-forming part includes
a plurality of the semiconductor light-emitting devices,
a plurality of the lenses individually disposed so as to correspond to the plurality of semiconductor light-emitting devices, and
a filter configured to multiplex light from the plurality of semiconductor light-emitting devices.

7. The optical module according to claim 6, wherein the plurality of semiconductor light-emitting devices include a semiconductor light-emitting device configured to emit red light, a semiconductor light-emitting device configured to emit green light, and a semiconductor light-emitting device configured to emit blue light.

8. The optical module according to claim 1, wherein the semiconductor light-emitting device is a laser diode.

* * * * *